United States Patent
Park et al.

(10) Patent No.: US 8,184,688 B2
(45) Date of Patent: *May 22, 2012

(54) DIGITAL BROADCASTING RECEPTION APPARATUS AND ROBUST STREAM DECODING METHOD THEREOF

(75) Inventors: Eui-jun Park, Seoul (KR); Hae-joo Jeong, Seoul (KR); Joon-soo Kim, Seoul (KR); Jung-pil Yu, Suwon-si (KR); Yong-sik Kwon, Seoul (KR); Jin-hee Jeong, Anyang-si (KR); Kum-ran Ji, Seoul (KR); Jong-hun Kim, Suwon-si (KR); Yong-deok Chang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1508 days.

This patent is subject to a terminal disclaimer.

(21) Appl. No.: 11/702,097

(22) Filed: Feb. 5, 2007

(65) Prior Publication Data
US 2007/0195891 A1    Aug. 23, 2007

Related U.S. Application Data

(60) Provisional application No. 60/765,175, filed on Feb. 6, 2006.

(51) Int. Cl.
*H04B 1/66* (2006.01)

(52) U.S. Cl. ............. 375/240.01; 375/265; 375/341; 375/349; 348/14.13; 348/385.1; 348/425.3; 348/432.1; 348/473

(58) Field of Classification Search .......... 375/219, 375/222, 240.01, 262, 264, 265, 270, 277, 375/285, 295, 296, 301, 316, 321, 340, 341, 375/346, 349; 348/14.13, 385.1, 393.1, 395.1, 348/397.1, 400.1, 403.1, 425.3, 432.1, 460, 348/473, 474; 370/912, 916
See application file for complete search history.

(56) References Cited

U.S. PATENT DOCUMENTS
2002/0126222 A1    9/2002    Choi et al.
(Continued)

FOREIGN PATENT DOCUMENTS
WO    WO 2005/115001    12/2005
(Continued)

OTHER PUBLICATIONS
Communication dated Oct. 5, 2010, issued in counterpart European Application No. 07708785.6-2223.
(Continued)

*Primary Examiner* — Dac Ha
(74) *Attorney, Agent, or Firm* — Sughrue Mion, PLLC (57) ABSTRACT

A digital broadcasting reception apparatus and robust stream decoding method thereof. The digital broadcasting reception apparatus includes a robust decoder that decodes a robust stream of a dual transport stream where a normal stream and the robust stream are combined. The robust decoder includes a first decoder that trellis-decodes the robust stream; a robust deinterleaver that interleaves the trellis-decoded robust stream; a second decoder that convolution decodes the deinterleaved robust stream; a robust interleaver that interleaves the convolution-decoded robust stream; and a frame formatter that adds decoded data of the second decoder to a part that corresponds to a position of the robust stream of a frame where the normal stream and the robust stream are mixed. Accordingly, a receiver of a simple structure can be provided.

7 Claims, 7 Drawing Sheets

U.S. PATENT DOCUMENTS

| | | |
|---|---|---|
| 2004/0028076 A1 | 2/2004 | Strolle |
| 2005/0097428 A1 | 5/2005 | Chang et al. |
| 2006/0088119 A1* | 4/2006 | Fu et al. ..................... 375/265 |
| 2009/0147889 A1* | 6/2009 | Chang et al. ................ 375/341 |

FOREIGN PATENT DOCUMENTS

| | | |
|---|---|---|
| WO | WO 2005/120062 | 12/2005 |
| WO | WO 2006/006833 | 1/2006 |

OTHER PUBLICATIONS

U.S. Appl. No. 11/416,256, filed May 2006, Eui-jun Park et al., Samsung Electronics Co., Ltd.
U.S. Appl. No. 11/416,250, filed May 2006, Eui-jun Park et al., Samsung Electronics Co., Ltd.
International Search Report mailed on May 8, 2007, in International Application No. PCT/KR2007/000635.
Written Opinion of the International Searching Authority mailed on May 8, 2007, in International Application No. PCT/KR2007/000635.

* cited by examiner

FIG. 3

FIG. 4A (a) | SYNC | PID | Robust data |
| 1 | 3 | 184 |

(b) | SYNC | PID | AF Header | Null data | Normal data |
| 1 | 3 | 2 | N | 182-N |

(c) | SYNC | PID | AF Header | Robust data | Normal data |
| 1 | 3 | 2 | N | 182-N |

FIG. 4B

| SYNC | PID | Robust data |
| SYNC | PID | Normal data |
| SYNC | PID | Normal data |
| SYNC | PID | Normal data |
| 1 | 3 | |

· · ·

FIG. 5A (a) | SYNC | PID | Robust data |
| --- | --- | --- |
| 1 | 3 | 184 |

(b) | SYNC | PID | AF Header | Stuff byte | Null data | Normal data |
| --- | --- | --- | --- | --- | --- |
| 1 | 3 | 2 | S | N | 182-N-S |

(c) | SYNC | PID | AF Header | Stuff byte | Robust data | Normal data |
| --- | --- | --- | --- | --- | --- |
| 1 | 3 | 2 | S | N | 182-N-S |

FIG. 5B

| SYNC | PID | AF Header | Stuff byte | Robust data |
| --- | --- | --- | --- | --- |
| 1 | 3 | 2 | S | 182-S |
| SYNC | PID | AF Header | Stuff byte | Normal data |
| SYNC | PID | AF Header | Stuff byte | Normal data |
| SYNC | PID | AF Header | Stuff byte | Normal data |

DIGITAL BROADCASTING RECEPTION APPARATUS AND ROBUST STREAM DECODING METHOD THEREOF

CROSS-REFERENCE TO RELATED APPLICATIONS

This application claims the benefit of U.S. Provisional Application No. 60/765,175 filed Feb. 6, 2006, in the United States Patents and Trademark Office, the disclosure of which is incorporated herein by reference.

BACKGROUND OF THE INVENTION

1. Field of the Invention

Aspects of the present invention generally relate to a digital broadcasting reception apparatus and a robust stream decoding method thereof. More particularly, aspects of the present invention relate to a digital broadcasting reception apparatus and robust stream decoding method thereof so as to provide a receiving apparatus of a simple structure.

2. Description of the Related Art

The Advanced Television Systems Committee (ATSC) vestigial sideband (VSB) scheme, which is a terrestrial digital broadcasting system in U.S.A., is disadvantageous in that its reception performance is not good in a poor channel environment, particularly, in a Doppler fading channel environment. Thus, the ATSC has accepted new suggestions under preconditions that compatibility with existing receivers is provided, that the existing receivers do not suffer performance depreciation, and that the performance is improved in comparison with the existing receivers in order to enhance the VSB reception performance.

Among the suggestions for VSB system improvement, a dual transport stream scheme enables watching of the existing HD video in a good channel environment and allows for video reception even in a poor channel environment. The dual transport stream scheme generates and transmits a dual transport stream with robust data added to normal data of the conventional ATSC VSB so as to successfully operate in a hostile channel environment.

Figure 1:
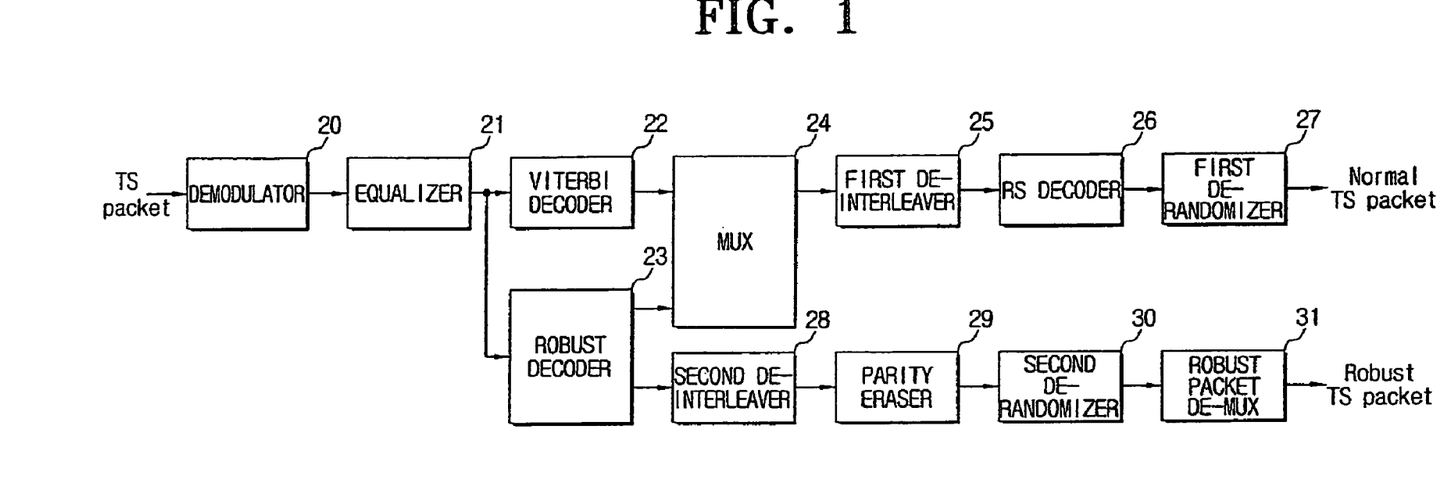
FIG. 1 is a block diagram of a conventional VSB reception apparatus.
Figure 2:
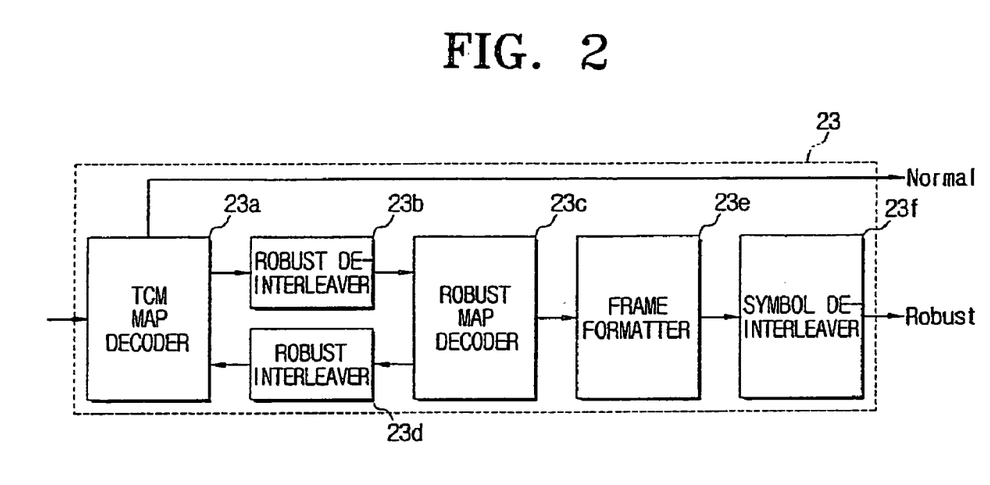
FIG. 2 is a block diagram of a robust decoder of FIG. 1.

Hereafter, in reference to FIGS. 1 and 2, a conventional dual transport stream reception system is described that provides good performance by transmitting and receiving a normal stream and a robust stream and exchanging information by the robust stream.

FIG. 1 is a block diagram of a conventional VSB receiving apparatus, and FIG. 2 is a block diagram of a robust decoder of FIG. 1.

Referring to FIG. 1, the conventional VSB receiving apparatus includes a demodulator 20 for processing the dual transport stream received from the VSB transmission apparatus of FIG. 1, an equalizer 21, a viterbi decoder 22, a robust decoder 23, a MUX 24, a first deinterleaver 25, an RS decoder 26, a first derandomizer 27, a second deinterleaver 28, a parity eraser 29, a second derandomizer 30, and a robust packet DE-MUX 31.

Referring now to FIG. 2, the robust decoder 23 of FIG. 1 includes a TCM MAP decoder 23a (TCM refers to trellis code modulation; MAP refers to maximum a posteriori probability), a robust deinterleaver 23b, a robust MAP decoder 23c, a robust interleaver 23d, a frame formatter 23e, and a symbol deinterleaver 23f.

As shown in the drawings, information exchange is conducted through a loop formed between the TCM MAP decoder 23a and the robust MAP decoder 23c until sufficient performance is acquired. Upon the completion of the information exchange, the data output from the TCM MAP decoder 23a is used for receiving the normal stream, and the frame formatter 23e forwards the data output from the robust MAP decoder 23c to a position corresponding to the robust stream of the normal stream and the robust stream. In doing so, the empty position corresponding to the normal stream is outputted via the symbol deinterleaver 23f to be used for the robust stream reception.

As discussed above, when the conventional VSB transmission and reception apparatuses add the robust coding, such as a 1/4 rate coding, to the robust stream using the robust encoder 13c, the VSB receiving apparatus of FIG. 2 should be constructed in accordance with the structure of a conventional VSB transmission apparatus. As shown, the VSB receiving apparatus has a complicated structure.

SUMMARY OF THE INVENTION

Aspects of the present invention have been provided to address the above-mentioned and other problems and disadvantages occurring in the conventional arrangement, and an aspect of the present invention is to provide a receiver of a simple structure for the performance improvement of a robust stream included in a dual transport stream even when additive coding is implemented at various rates.

Additional aspects and/or advantages of the invention will be set forth in part in the description which follows and, in part, will be obvious from the description, or may be learned by practice of the invention.

In accordance with an aspect of the present invention, a digital broadcasting reception apparatus includes a robust decoder that decodes a robust stream of a dual transport stream wherein a normal stream and the robust stream are combined. The robust decoder includes a first decoder that trellis-decodes the robust stream; a robust deinterleaver that deinterleaves the trellis-decoded robust stream; a second decoder that convolution-decodes the deinterleaved robust stream; a robust interleaver that interleaves the convolution-decoded robust stream; and a frame formatter that adds the decoded data of the second decoder to a part that corresponds to a position of the robust stream of a frame where the normal stream and the robust stream are mixed.

When information exchange between the first decoder and the second decoder is completed through the robust deinterleaver and the robust interleaver, the decoded data of the first decoder may be outputted to be used for the normal stream reception and the decoded data of the second decoder may be provided to the frame formatter.

The digital broadcasting reception apparatus may further include a symbol deinterleaver that converts the decoded data of the first decoder by the byte; and a symbol interleaver that converts the decoded data of the second decoder by the symbol.

In accordance with another aspect of the present invention, a robust stream decoding method of a dual transport stream wherein a normal stream and a robust stream are combined at a digital broadcasting reception apparatus, includes trellis-decoding the robust stream; deinterleaving the trellis-decoded robust stream; convolution-decoding the deinterleaved robust stream; interleaving the deinterleaved robust stream; and adding the convolution-decoded data to a part that corresponds to a position of the robust stream of a frame where the normal stream and the robust stream are mixed.

The trellis-decoded data may be outputted to be used for the normal stream reception, and the convolution-decoded data may be added to a part corresponding to a position of the robust stream.

The robust stream decoding method may further include converting the trellis-decoded data by the byte; and converting convolution decoded data by the symbol.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
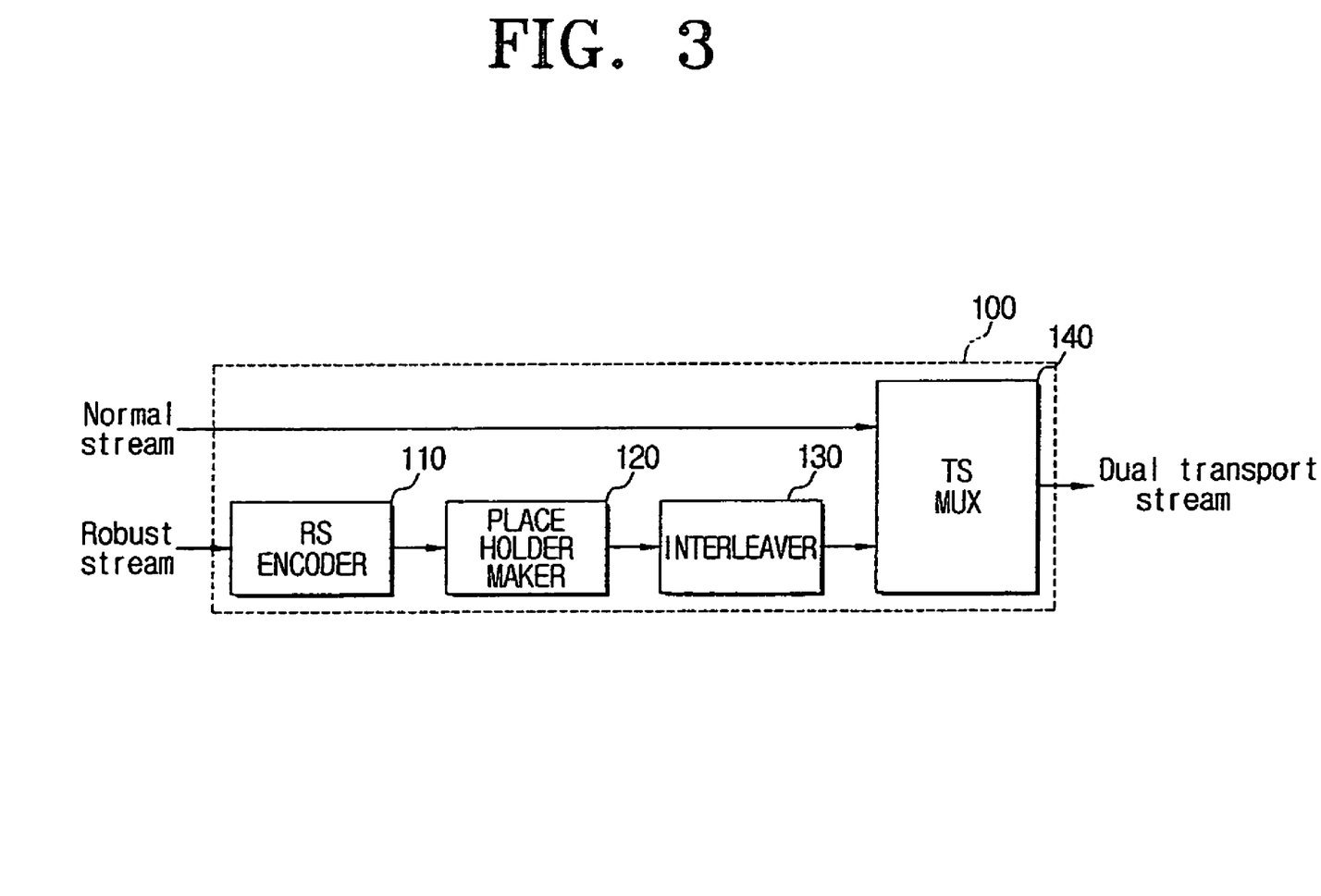
FIG. 3 is a block diagram of a TS constructor which is applied to the present invention.

FIG. 3 is a block diagram of a TS constructor.

A dual transport stream, which is applied to aspects of the present invention, is the combination of a normal stream and a robust stream. The dual transport stream can be generated at the TS constructor 100 of FIG. 3.

Referring now to FIG. 3, the TS constructor 100 includes a Reed-Solomon (RS) encoder 110, a place holder maker 120, an interleaver 130, and a TS MUX 140.

A normal stream and a robust stream are respectively input to the TS constructor 100. At this time, the normal stream is input directly to the TS MUX 140, whereas only the robust stream passes through the TS encoder 110, the place holder maker 120, and the interleaver 130 and then is fed to the TS MUX 140.

Parity is added to the robust stream at the RS encoder 110, and the place holder maker 120 generates an area to which parity is to be inserted by the robust encoder, which will be explained later. The robust stream is interleaved at the interleaver 130. Next, TS MUX 140 constructs a dual transport stream by multiplexing the normal stream and the robust stream. This method of generating a dual transport stream is well known to persons skilled in the art, and thus the detailed description of the TS constructor 100 will be omitted for brevity.

Figure 4A:
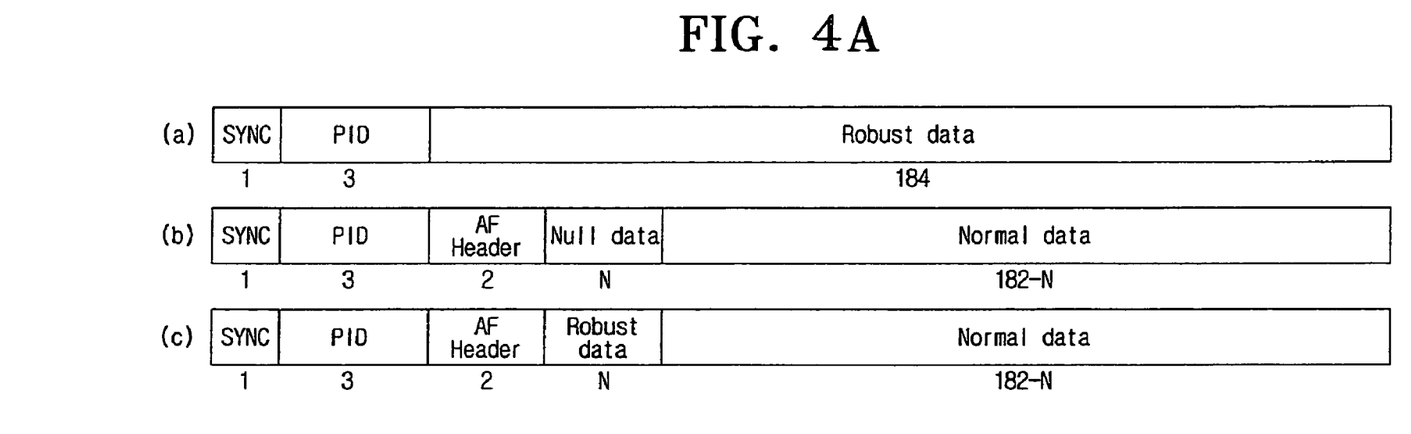
FIGS. 4A and 4B are diagrams showing a format of a dual transport stream.
Figure 4B:
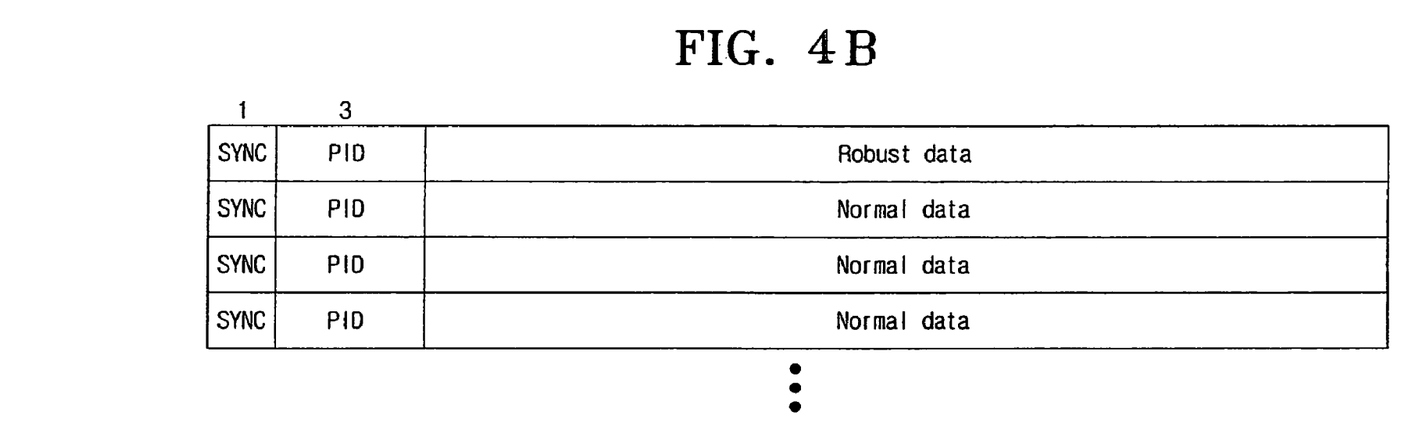

FIGS. 4A and 4B are diagrams showing formats of a dual transport stream.

Typically, a MPEG packet consists of a 1-byte sync, a 3-byte header, and a 184-byte payload. The header of the MPEG packet includes a packet identifier (PID). The type of data contained in the payload part determines whether the MPEG packet is the normal stream or the robust stream.

Stream (a) of FIG. 4A is an example of the robust stream inputted to the TS constructor 100. The payload part contains the robust data. The robust data is processed at the RS encoder 110, the placer holder maker 120, and the interleaver 130 of the TS constructor 100 and then fed to the TS MUX 140.

Stream (b) of FIG. 4A is an example of the normal stream inputted to the TS constructor 100. While the payload part contains the normal data, the stream (b) also includes an adaptation field into which the robust data is inserted by taking account of the combination with the robust stream. The adaptation field includes a 2-byte AF header and an N-byte null data space.

The robust stream (a) of FIG. 4A and the normal stream (b) of FIG. 4A are multiplexed at the TS MUX 140 to thus construct a dual transport stream as shown in stream (c) of FIG. 4A.

FIG. 4B shows another combination of the robust stream and the normal stream. A whole packet contains either the robust data or the normal data. The TS MUX 140 arranges the robust stream and the normal stream in the ratio of 1:3. Although the robust stream and the normal stream are shown as arranged in the ratio of 1:3 by way of example, the arrangement is not limited to this exemplary ratio.

Figure 5A:
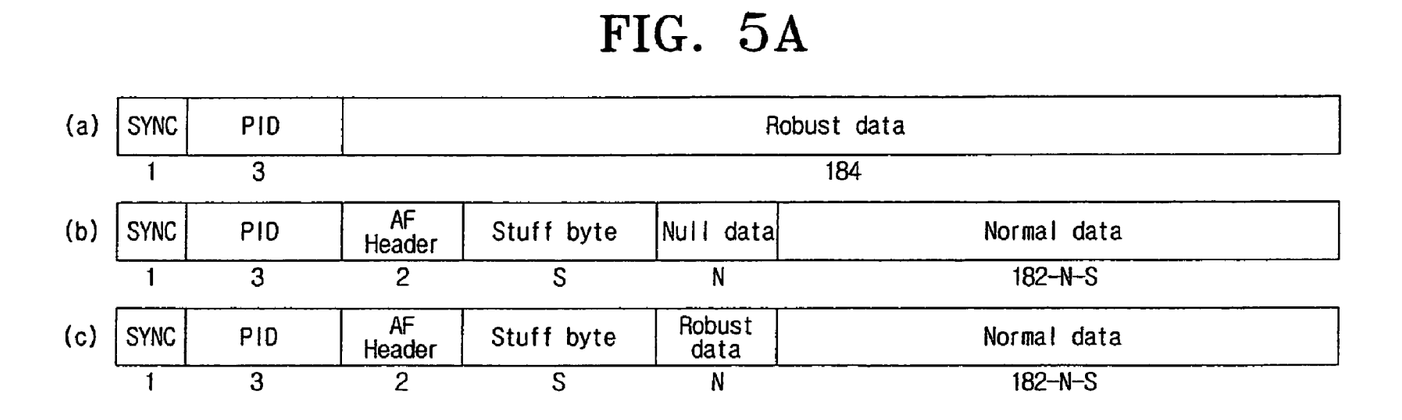
FIGS. 5A and 5B are diagrams showing another format of the dual transport stream.
Figure 5B:
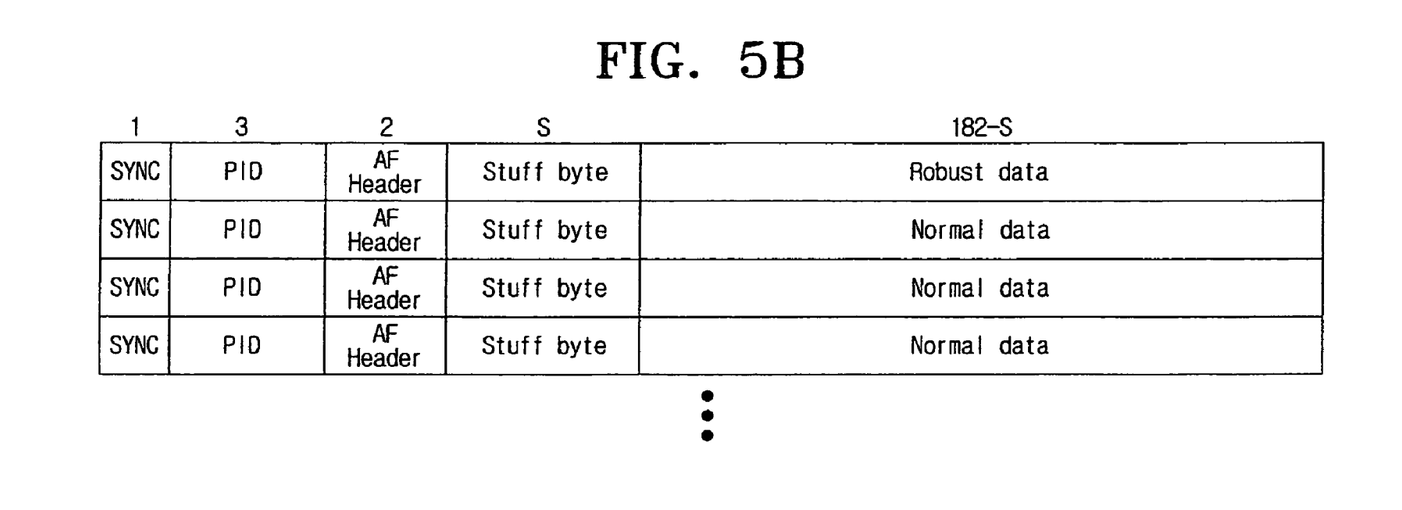

FIGS. 5A and 5B are diagrams showing another format of the dual transport stream.

Stream (a) of FIG. 5A is a robust stream, and stream (b) of FIG. 5A is a normal stream including an S-byte stuff byte in the adaptation field. The S-byte stuff byte is an area to which a supplementary reference sequence (SRS) will be inserted by an SRS inserter, to be explained. The TS MUX 140 constructs a dual transport stream as shown in stream (c) by combining the robust stream (a) and the normal stream (b).

FIG. 5B shows a combination of the robust stream including the stuff byte and the normal stream in which a whole packet contains either the robust data or the normal data. The the robust stream and the normal stream are arranged in the ratio of 1:3 by way of example. It should be noted that the positions of the robust data and the stuff byte may be altered if necessary.

A digital broadcasting transmission apparatus that receives the dual transport stream of FIG. 4A or FIG. 4B is described herein to provide a context for a more detailed discussion of the digital broadcasting reception apparatus. The digital broadcasting transmission apparatus, which may transmit to a digital broadcasting reception apparatus according to an aspect of the present invention may include a randomizer, a parity area appender, a first interleaver, a robust processor, a deinterleaver, an RS encoder, a second interleaver, a trellis encoder, and a MUX. The randomizer randomizes the dual transport stream input from the TS constructor 100. The dual transport stream fed to the randomizer is formatted as in stream (c) of FIG. 4A or as in FIG. 4B. If an MPEG header is used, the dual transport stream may be 188 bytes. If an MPEG header is not used, the dual transport stream may be 187 bytes. The parity area appender adds an area so that the parity can be inserted into the randomized dual transport stream for error correction. The parity is inserted to this area at the RS encoder, to be explained. The first interleaver interleaves the dual transport stream having the appended area for inserting the parity. The interleaving serves to change data positions in a frame, rather than to change the data per se. The robust processor performs encoding in order to improve the performance of the robust stream included in the interleaved dual transport stream. The first deinterleaver deinterleaves the dual transport stream processed at the robust processor. The RS encoder appends parity to the deinterleaved dual transport stream. In doing so, the RS encoder inserts the parity into the area that was added to the dual transport stream by the parity area appender. The second interleaver interleaves the dual transport stream having the appended parity. The trellis encoder performs the trellis encoding to the interleaved dual transport stream. The MUX adds a segment sync signal and a field sync signal to the trellis-encoded dual transport stream and multiplexes it. Next, the dual transport stream to which the segment sync signal and the field sync signal have been added passes through channel modulation and conversion to a signal of an RF channel band, and then is transmitted.

A digital broadcasting transmission apparatus that may transmit to a digital broadcasting reception apparatus according to an aspect of the present invention may also include a randomizer, an SRS inserter, a parity area appender, a first interleaver, a robust processor, a deinterleaver, an RS encoder, a second interleaver, a compatibility parity generator, a trellis encoder, and a MUX.

The randomizer receives the dual transport stream which includes the stuff byte in the adaptation field as shown in stream (c) of FIG. 5A or as shown in FIG. 5B. The SRS inserter inserts an SRS into the stuff byte included in the dual transport stream which has been randomized at the randomizer. In doing so, the loss and mixing ratio of the payload due to the SRS can be determined according to the rate of insertion of the AF header and the stuff byte into the dual transport stream. The compatibility parity generator generates a compatibility parity based on a packet of the dual transport stream to which the parity is appended by the RS encoder and based on the dual transport stream that is trellis-encoded by the trellis encoder. The compatibility parity generator provides the generated compatibility parity to the trellis encoder. The trellis encoder trellis-encodes the dual transport stream that has been interleaved by the second interleaver and provides the trellis-encoded dual transport stream to the compatibility parity generator. Afterwards, when the compatibility parity is fed from the compatibility parity generator, the trellis encoder appends the compatibility parity to the interleaved dual transport stream and provides it to the MUX. The MUX adds a segment sync signal and a field sync signal to the dual transport stream to which the compatibility parity has been appended by the trellis encoder, multiplexes and outputs the resultant stream.

A robust processor that is used with the transmitter may include an N/R DE-MUX, a robust encoder, a robust interleaver, and an N/R MUX. The N/R DE-MUX demultiplexes the dual transport stream that has been interleaved by the first interleaver and thus separates the normal stream and the robust stream. Next, the N/R DE-MUX converts the bytewise robust stream into two bits starting from a most significant bit (MSB) to a least significant bit (LSB) in order, and provides the converted two bits to the robust interleaver.

For instance, when 1-byte input, that is, an 8-bit input is numbered from the MSB to the LSB in order, such as 7, 6, 5, 4, 3, 2, 1, 0, the 8-bit input is converted to 4 symbols in the order of (7, 6), (5, 4), (3, 2), and (1, 0).

Next, the N/R DE-MUX provides the normal stream, which is separated through the demultiplexing, to the N/R MUX, and provides the robust stream, which is converted to the symbols, to the robust encoder.

The robust encoder convolutionally encodes the robust stream fed from the N/R DE-MUX. Herein, convolution encoding refers to parity appending with respect to the robust stream.

An encoder of a Recursive Systematic Code (RSC) type can be used as the robust encoder 207b and will be described in further detail in reference to FIG. 6.

The robust interleaver interleaves the convolutionally encoded robust stream. The N/R MUX outputs a dual transport stream by multiplexing the normal stream fed from the N/R DE-MUX and the robust stream fed from the symbol deinterleaver.

The robust processor may include a symbol deinterleaver. The symbol deinterleaver deinterleaves the interleaved robust stream.

Figure 6:
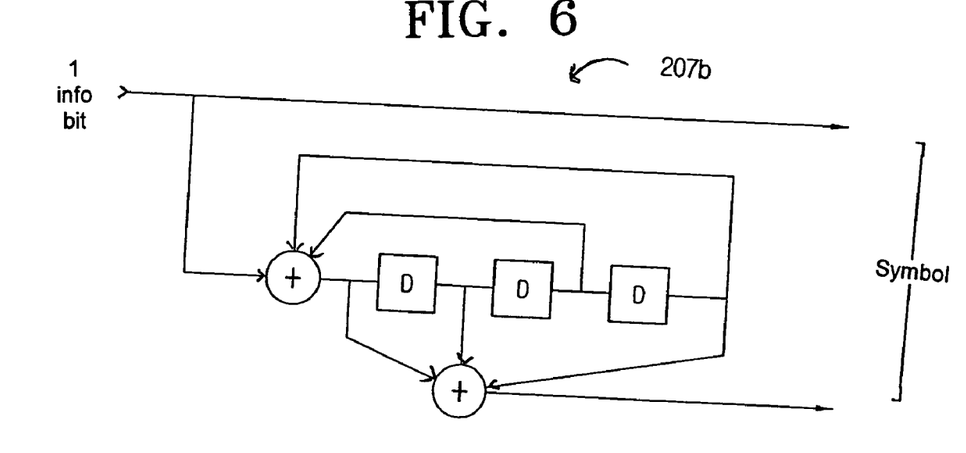
FIG. 6 is a diagram showing a robust encoder of FIG. 10.

FIG. 6 is a diagram showing the robust encoder.

The robust encoder operates in association with the place holder maker 120, which has been illustrated in reference to FIG. 3. For instance, if the place holder maker 120 generates the input data of 7, 6, 5, 4, 3, 2, 1, 0 starting from the MSB to the LSB to the 2-byte data in order of (7, x, 6, x, 5, x, 4, x) and (3, x, 2, x, 1, x, 0, x) for the 1/2 rate coding, the robust encoder receives and codes only the data of 7, 5, 3, 1 of the 2 bits forming one symbol when the input data is converted to 4 symbols in order of (7, 6), (5, 4), (3, 2), (1, 0).

The generated output of 2 bits may be replaced even in a part having no information. When the encoder of the RSC type as shown in FIG. 6 is used for the robust encoder, parities are simply replaced in the part having no information since there is no change to the input and the output.

In an embodiment wherein the robust encoder performs the coding of 1/4 rate, the place holder maker 120 fills only one bit of 4 successive bits with data having information, and inserts an arbitrary value in the remaining three bits. At this time, of 2 symbols consecutively fed to the robust encoder, only one bit has information. As mentioned earlier, the robust encoder operates with respect to only one bit of the data input, and creates the output of 4 bits to replace a 4-bit part having information or having no information.

For instance, when the place holder maker 120 outputs (a, x, y, z) with respect to an input 1-bit "a" (x, y, z are arbitrary values having no information), two symbols of (a, x), (y, z) being input in sequence are generated by a byte-to-symbol conversion, which is well-known. Only the data part "a" of the input is received in accordance with the operation of the place holder maker 120 so as to output 4 bits. The output 4 bits are replaced with the input 2 symbols of (a, x) and (y, z).

In the embodiment wherein an RSC type encoder as shown in FIG. 6 (the encoder of 1/2 rate) is used for the robust encoder 207b, the output resulting from the 1/4 rate may be duplicated.

When two symbols of (a, x), (y, z) are received as the input, only "a" is used as the input and (p1, p2) is outputted. When the output (p1, p2) is generated, (a, p), (a, p) may be outputted.

Of the successive 4-bit output generated for the coding of 1/4 rate at the place holder maker 120, the position of the input data may be arbitrary. The robust encoder 207b can employ only the agreed data as the input using the data position agreed with the place holder maker 120, and replace all of the 4-bit input by making an output.

As illustrated above, when the place holder maker 120 operates, two successive symbols, which are generated from 1-bit input data using the byte-to-symbol conversion, which groups two bits starting from the MSB to the LSB, are fed to the robust encoder.

In other words, if a conventional robust processor includes the symbol deinterleaver, since the two-symbol positions generated from the 1-bit input are mixed, the conventional digital broadcasting reception apparatus needs to match the two-symbol position at the design phase.

However, in the digital broadcasting transmission apparatus that may transmit to a digital broadcasting reception apparatus according to an aspect of the present invention, as the outputted two symbols generated from the data input appear in succession, the positions of the two symbols can be acquired at any time. Thus, the design of the digital broadcasting receiving apparatus can be simplified.

The symbol deinterleaver of the robust processor serves to deinterleave the interleaved robust stream. The symbol deinterleaver includes an N/R MUX, a byte/symbol converter, and an N/R DE-MUX. The output of the robust encoder passes through the robust interleaver, which is used to improve the performance in the information exchange at a robust decoder of a digital broadcasting receiving apparatus, to be explained, and the symbol deinterleaver. Next, the output is inserted into the original position of the robust stream by combining with the normal stream at the N/R MUX and then is outputted. The symbol deinterleaver is used to fulfill the simple information exchange by virtue of the N/R MUX, the byte/symbol converter, and the N/R DE-MUX, without having to passing through the conventional byte-to-symbol conversion at the digital broadcasting receiving apparatus. The N/R MUX multiplexes and combines the normal stream and the robust stream fed to the symbol deinterleaver. The byte/symbol converter converts the normal stream and the robust stream that are multiplexed at the N/R MUX, by the byte.

The N/R DE-MUX demultiplexes and separates the normal stream and the robust stream that were converted by the byte at the byte/symbol converter, and then outputs the separated streams.

The symbol deinterleaver of a conventional robust processor operates with respect to all data of the normal stream and the robust stream, whereas the symbol deinterleaver that is used with the digital broadcasting transmission apparatus that may transmit to a digital broadcasting reception apparatus according to an aspect of the present invention operates with respect to only the robust stream. In addition, the symbol deinterleaver can be set to have a different value according to the robust stream position of the input data.

As the symbol deinterleaver is affected by the deinterleaver and the byte-to-symbol conversion, its size is equal to the symbol size transmitted to the robust stream for 52 segments. For instance, the number of robust stream space appearing in 52 segments is 52/4+13. Herein, by taking account of the conversion of 1 byte to 4 symbols, the symbol deinterleaver can serve as a 128*4*13=6656 block interleaver.

The symbol deinterleaver and the robust interleaver may also be implemented as a single interleaver. In other words, the symbol deinterleaver and the robust interleaver operate in the same unit size.

In the robust stream coding method used in the digital broadcasting transmission apparatus that transmits to a digital broadcasting reception apparatus according to an aspect of the present invention, prior to the input to the robust processor, the dual transport stream goes through randomization, parity area generation, and interleaving. The robust stream included in the dual transport stream is coded at the robust processor. When the dual transport stream is input to the robust processor, the N/R DE-MUX separates the normal stream and the robust stream by demultiplexing the dual transport stream. The N/R DE-MUX converts the separated robust stream by the symbol, provides the normal stream directly to the N/R MUX, and provides only the robust stream to the robust encoder. The robust encoder appends the parity to the robust stream fed from the N/R DE-MUX. The robust interleaver interleaves the parity-appended robust stream.

The symbol deinterleaver deinterleaves the interleaved symbol-wise robust stream. In doing so, the symbol deinterleaver converts and outputs the robust stream by the byte. After passing through the robust encoder, the robust interleaver, and the symbol deinterleaver, the robust stream separated at the N/R DE-MUX is fed to the N/R MUX. The N/R MUX multiplexes the normal stream fed from the N/R DE-MUX and the robust stream fed from the symbol deinterleaver. Next, the dual transport stream multiplexed at the N/R MUX is transmitted after passing through deinterleaving, RS encoding, interleaving, trellis encoding, multiplexing FIG. 7 is a block diagram of a digital broadcasting receiving apparatus according to an aspect of the present invention.

Figure 7:
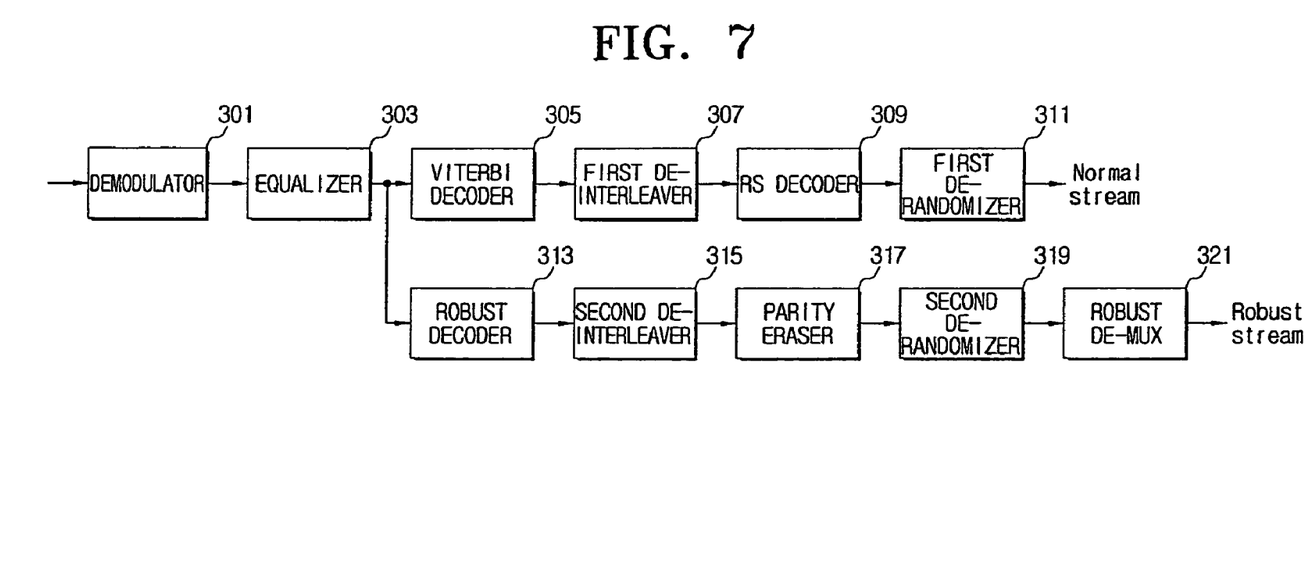
FIG. 7 is a block diagram of a digital broadcasting receiving apparatus which is applied to the present invention.

Referring to FIG. 7, the digital broadcasting receiving apparatus applied to the present invention, includes a demodulator 301, an equalizer 303, a viterbi decoder 305, a first deinterleaver 307, an RS decoder 309, a first derandomizer 311, a robust decoder 313, a second interleaver 315, a parity eraser 317, a second derandomizer 319, and a robust DE-MUX 321.

The demodulator 301 receives the dual transport stream from the digital broadcasting transmission apparatus described above, detects sync according to the sync signal added to the baseband signal, and performs the demodulation.

The equalizer 303 equalizes the dual transport stream demodulated by the demodulator 301. In more detail, the equalizer 303 can remove the interference of the received symbols by compensating the channel distortion of the dual transport stream due to channel multipath.

The viterbi decoder 305 corrects errors with respect to the normal stream of the dual transport stream and outputs a symbol packet by decoding the error-corrected symbol.

The first deinterleaver 307 deinterleaves the normal stream that has been viterbi-decoded by the viterbi decoder 305.

The RS decoder 309 RS-decodes the normal stream that has been deinterleaved by the first deinterleaver 307.

The first derandomizer 311 derandomizes and outputs the normal stream that has been RS-decoded by the RS decoder 310.

The robust decoder 313 decodes the robust stream of the dual transport stream equalized by the equalizer 303. The robust decoder 313 will be illustrated in detail in reference to FIGS. 8 and 9.

The second interleaver 315 interleaves the robust stream decoded by the robust decoder 313.

The parity eraser 317 eliminates the parity that was appended to the robust stream interleaved by the second interleaver 315.

The second derandomizer 319 derandomizes the robust stream from which the parity was eliminated by the parity eraser 317.

The robust DE-MUX 321 demultiplexes the robust stream that was derandomized by the second derandomizer 319.

Figure 8:
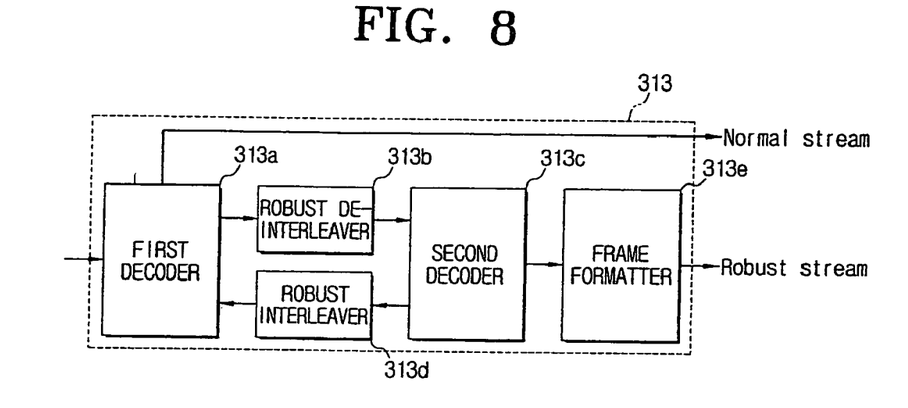
FIG. 8 is a block diagram of a robust decoder according to one embodiment of the present invention.

FIG. 8 is a block diagram of a robust decoder according to one embodiment of the present invention.

Referring to FIG. 8, the robust decoder 313 includes a first decoder 313a, a robust deinterleaver 313b, a second decoder 313c, a robust interleaver 313d, and a frame formatter 313e.

The first decoder 313a trellis-decodes the robust stream.

The robust deinterleaver 313b deinterleaves the robust stream that was trellis-decoded by the first decoder 313a.

The second decoder 313c convolution-decodes the robust stream deinterleaved by the robust deinterleaver 313b.

The robust interleaver 313d interleaves the robust stream convolution-decoded by the second decoder 313c.

The frame formatter 313e adds the decoded data of the second decoder 313c to the part that corresponds to the position of the robust stream in the frame where the normal stream and the robust stream are mixed.

When the information exchange is completed between the first decoder 313a and the second decoder 313c through the robust deinterleaver 313b and the robust interleaver 313d, the decoded data of the first decoder 313a is outputted to be used for the normal stream reception and the decoded data of the second decoder 313c is provided to the frame formatter 313e.

Figure 9:
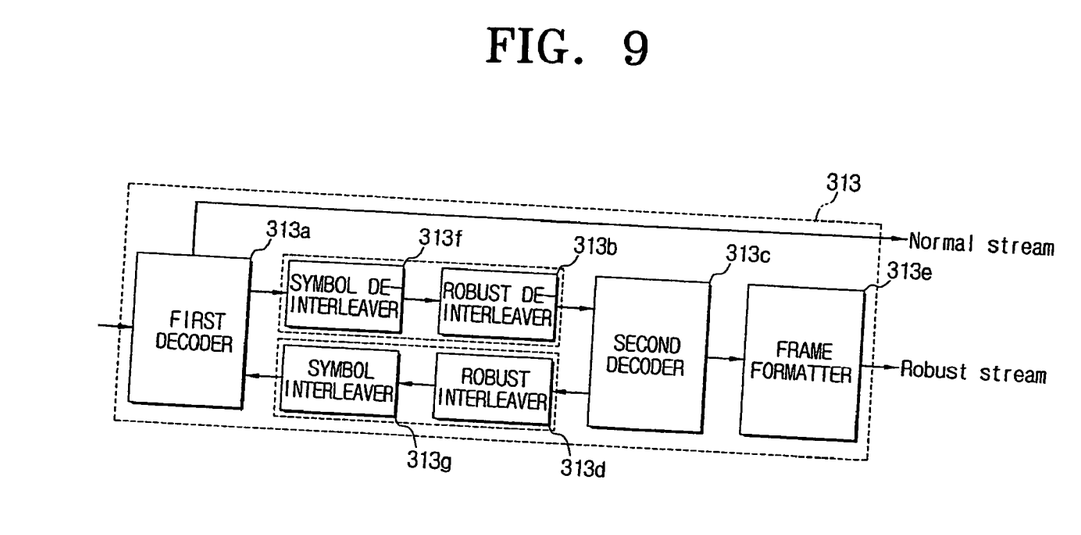
FIG. 9 is a block diagram of a robust decoder according to another embodiment of the present invention.

FIG. 9 is a block diagram of a robust decoder 313 according to another embodiment of the present invention. Because the robust decoder 313 of FIG. 9 has a similar structure to the robust decoder 313 of FIG. 8 and shares the same elements, but with added features as described herein, the same reference numeral 313 is used herein to identify both the robust decoder 313 of FIG. 8 and the robust decoder 313 of FIG. 9.

Referring to FIG. 9, the robust decoder 313 includes a first decoder 313a, a symbol deinterleaver 313f, a robust deinterleaver 313b, a symbol interleaver 313g, a robust interleaver 313d, a second decoder 313c, and a frame formatter 313e.

The decoded data of the first decoder 313a is in a symbol unit. After the decoded data is converted by the byte at the symbol deinterleaver 313f, it is deinterleaved by the robust deinterleaver 313b. The decoded data of the second decoder 313c is in a byte unit. After the decoded data is interleaved by the robust interleaver 313d, it is converted by the symbol by the symbol interleaver 313g.

Figure 10:
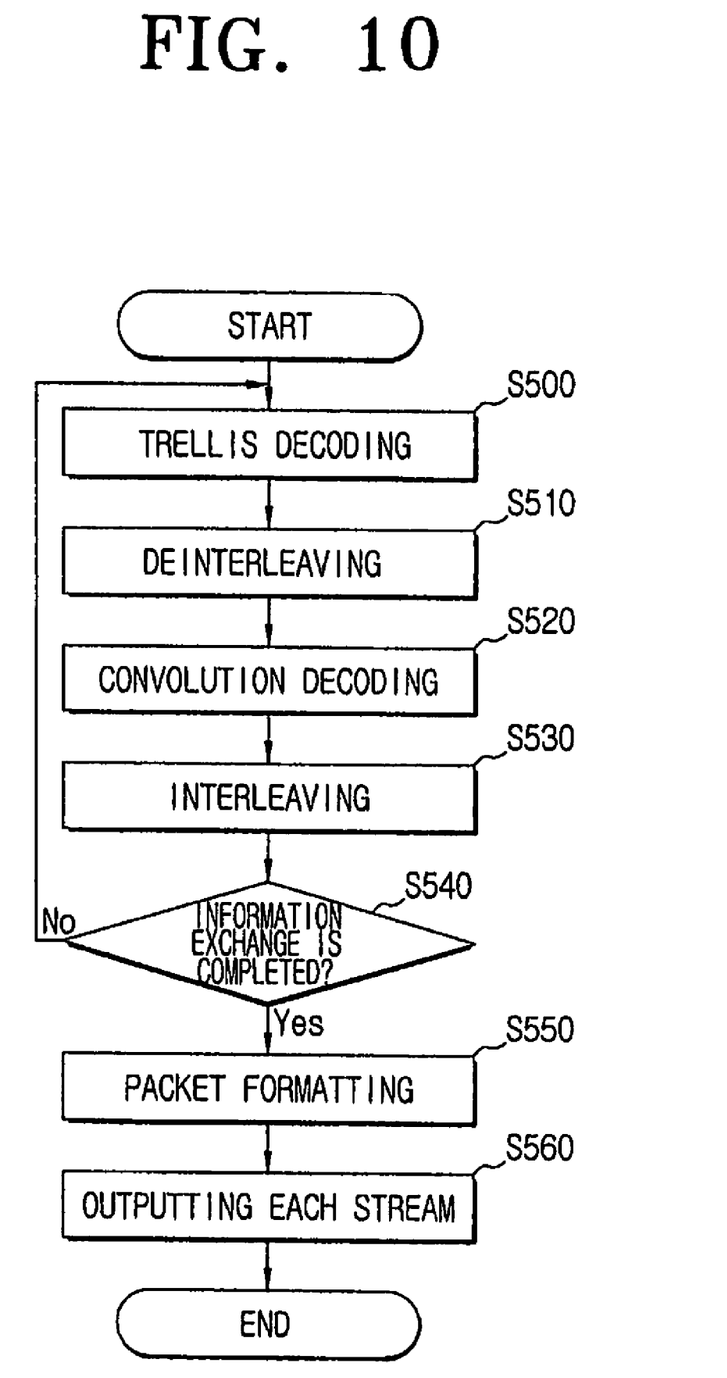
FIG. 10 is a flowchart outlining a robust stream decoding method according to an embodiment of the present invention.

FIG. 10 is a flowchart outlining a robust stream decoding method according to an embodiment of the present invention.

The dual transport stream transmitted from the digital broadcasting transmission apparatus is received at the digital broadcasting receiving apparatus as shown in FIG. 7. The dual transport stream goes through demodulation and equalization. The robust stream included in the dual transport stream is fed to and decoded at the robust decoder 313. Herein, the robust stream decoding method at the robust decoder 313 of FIG. 9 will be described. However, the method at the robust decoder 313 of FIG. 8 is similar.

The robust stream input to the robust decoder 313 is trellis-decoded at the first decoder 313a at operation S500. The trellis-decoded robust stream is deinterleaved at the symbol deinterleaver 313f and robust deinterleaver 313b at operation S510.

The deinterleaved robust stream is convolution-decoded at the second decoder 313c at operation S520. The convolution-decoded robust stream is interleaved at the robust interleaver 313d and symbol interleaver 313g at operation S530.

As the above process is repeated, an information exchange is conducted between the first decoder 313a and the second decoder 313c. Upon the completion of the information exchange at operation S540-Y, the frame formatter 313e adds the decoded data of the second decoder 313c to the part corresponding to the position of the robust stream of the frame (packet formatting) at operation S550. The first decoder 313a and the frame formatter 313e output the normal stream and the robust stream respectively at operation S560.

However, when the information exchange is not yet completed at operation S540, the information exchange continues along the loop formed between the first decoder 313a and the second decoder 313c until the information exchange is completed. In other words, the process returns according to operation 540-N to operation S500 when the information exchange has not been completed.

When the normal stream and the robust stream are produced from the robust decoder 313, the normal stream passes through deinterleaving, RS decoding, and derandomization and the robust stream passes through deinterleaving, parity elimination, derandomization, and demultiplexing as shown, for example, in FIG. 7.

As set forth, according to an embodiment of the present invention, the digital broadcasting transmission and reception apparatuses and the robust stream coding and decoding methods thereof do not complicate the structure of the receiver even when the additional coding is implemented at various rates to improve the performance of the robust stream included in the dual transport stream. In addition, advantageously, the compatibility with the existing transmission and reception apparatuses are enabled.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A digital broadcasting reception apparatus including a robust decoder that decodes a robust stream of a dual transport stream where a normal stream and the robust stream are combined, wherein the robust decoder comprises:
   a first decoder that trellis-decodes the robust stream;
   a robust deinterleaver that interleaves the trellis-decoded robust stream;
   a second decoder that convolution decodes the deinterleaved robust stream;
   a robust interleaver that interleaves the convolution-decoded robust stream; and
   a frame formatter that adds decoded data of the second decoder to a part that corresponds to a position of the robust stream of a frame where the normal stream and the robust stream are mixed.

2. The digital broadcasting reception apparatus of claim 1, wherein, the first decoder and the second decoder carry out information exchange through the robust deinterleaver and the robust interleaver and wherein, when the information exchange is completed, the decoded data of the first decoder is output to be used for normal stream reception and the decoded data of the second decoder is provided to the frame formatter.

3. The digital broadcasting reception apparatus of claim 1, wherein the robust decoder further comprises:
   a symbol deinterleaver that converts the data of the first decoder by the byte; and
   a symbol interleaver that converts the data of the second decoder by the symbol.

4. A digital broadcasting reception apparatus including a demodulator, an equalizer, a viterbi decoder, a first deinterleaver, an RS decoder, a first derandomizer, a robust decoder, a second interleaver, a parity eraser, a second derandomizer, and a robust DE-MUX,
   wherein the robust decoder decodes a robust stream of a dual transport stream where a normal stream and the robust stream are combined and comprises:
   a first decoder that trellis-decodes the robust stream;
   a robust deinterleaver that interleaves the trellis-decoded robust stream;
   a second decoder that convolution decodes the deinterleaved robust stream;
   a robust interleaver that interleaves the convolution-decoded robust stream; and
   a frame formatter that adds decoded data of the second decoder to a part that corresponds to a position of the robust stream of a frame where the normal stream and the robust stream are mixed.

5. A robust stream decoding method of a dual transport stream where a normal stream and a robust stream are combined at a digital broadcasting reception apparatus, the method comprising:
   trellis-decoding the robust stream;
   deinterleaving the trellis-decoded robust stream;
   convolution-decoding the deinterleaved robust stream;
   interleaving the deinterleaved robust stream; and
   adding the convolution-decoded data to a part which corresponds to a position of the robust stream of a frame where the normal stream and the robust stream are mixed.

6. The robust stream decoding method of claim 5, wherein the trellis-decoded data is output to be used for the normal stream reception, and the convolution-decoded data is added to a part corresponding to a position of the robust stream.

7. The robust stream decoding method of claim 5, further comprising:
   converting the trellis-decoded data by the byte; and
   converting the convolution-decoded data by the symbol.

* * * * *